US012765423B2

(12) United States Patent
Uchiyama

(10) Patent No.: US 12,765,423 B2
(45) Date of Patent: Oct. 13, 2026

(54) SEMICONDUCTOR DEVICE AND METHOD FOR MANUFACTURING THE SAME

(71) Applicant: KIOXIA CORPORATION, Tokyo (JP)

(72) Inventor: Yasuhiro Uchiyama, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 46 days.

(21) Appl. No.: 18/316,051

(22) Filed: May 11, 2023

(65) Prior Publication Data

US 2023/0282621 A1 Sep. 7, 2023

Related U.S. Application Data

(63) Continuation of application No. 16/803,228, filed on Feb. 27, 2020, now Pat. No. 11,688,720.

(30) Foreign Application Priority Data

Sep. 18, 2019 (JP) ................................ 2019-169763

(51) Int. Cl.

| | |
|---|---|
| ***H01L 25/18*** | (2023.01) |
| ***H01L 27/11556*** | (2017.01) |
| ***H10W 72/20*** | (2026.01) |
| ***H10W 90/00*** | (2026.01) |
| *H10W 80/00* | (2026.01) |
| *H10W 90/20* | (2026.01) |

(52) U.S. Cl.

CPC ........... *H10W 90/00* (2026.01); *H10W 72/20* (2026.01); *H10W 80/312* (2026.01); *H10W 80/327* (2026.01); *H10W 90/20* (2026.01); *H10W 90/792* (2026.01)

(58) Field of Classification Search

CPC ........ H10B 43/27; H10B 43/50; H10B 41/27; H10B 43/40

See application file for complete search history.

(56) References Cited

U.S. PATENT DOCUMENTS

| | | | |
|---|---|---|---|
| 9,691,782 | B1 | 6/2017 | Hwang et al. |
| 11,043,506 | B2 | 6/2021 | Huo et al. |

(Continued)

FOREIGN PATENT DOCUMENTS

| | | | |
|---|---|---|---|
| CN | 105374819 | A | 3/2016 |
| CN | 205335260 | U | 6/2016 |

(Continued)

*Primary Examiner* — Nicholas J Tobergte
*Assistant Examiner* — David J Goodwin
(74) *Attorney, Agent, or Firm* — Foley & Lardner LLP

(57) ABSTRACT

According to one embodiment, a semiconductor device includes a substrate, a logic circuit provided on the substrate, and a memory cell array provided over the logic circuit that includes a plurality of electrode layers stacked on top of one another and a semiconductor layer provided over the plurality of electrode layers. The semiconductor device further includes a first plug and a second plug provided above the logic circuit and electrically connected to the logic circuit, a bonding pad provided on the first plug, and a metallic wiring layer provided on the memory cell array, electrically connected to the semiconductor layer, and electrically connected to the second plug.

18 Claims, 14 Drawing Sheets

(56) References Cited

U.S. PATENT DOCUMENTS

| | | | | |
|---|---|---|---|---|
| 11,069,703 | B2 | 7/2021 | Nishida et al. | |
| 11,688,720 | B2 * | 6/2023 | Uchiyama | H10B 43/40 257/777 |
| 2008/0050566 | A1 * | 2/2008 | Shishida | H01L 21/3148 257/E21.252 |
| 2016/0043165 | A1 | 2/2016 | Saito et al. | |
| 2017/0025423 | A1 | 1/2017 | Terada et al. | |
| 2017/0062321 | A1 * | 3/2017 | Choi | H01L 23/49838 |
| 2018/0261575 | A1 | 9/2018 | Tagami et al. | |
| 2019/0081069 | A1 | 3/2019 | Lu et al. | |
| 2019/0259774 | A1 | 8/2019 | Murakoshi et al. | |
| 2019/0363129 | A1 | 11/2019 | Yokoyama et al. | |
| 2020/0203329 | A1 * | 6/2020 | Kanamori | H10D 88/00 |
| 2020/0227397 | A1 | 7/2020 | Yada et al. | |
| 2021/0035965 | A1 * | 2/2021 | Mizutani | H01L 25/18 |
| 2021/0143096 | A1 | 5/2021 | Yun et al. | |
| 2021/0287986 | A1 | 9/2021 | Gwon et al. | |

FOREIGN PATENT DOCUMENTS

| | | | |
|---|---|---|---|
| CN | 106373964 | A | 2/2017 |
| CN | 107342291 | A | 11/2017 |
| CN | 108573959 | A | 9/2018 |
| CN | 109346473 | A | 2/2019 |
| CN | 110168725 | A | 8/2019 |
| CN | 110176457 | A | 8/2019 |
| JP | 2010-016165 | A | 1/2010 |
| JP | 2010-129686 | A | 6/2010 |
| TW | 201933546 | A | 8/2019 |

* cited by examiner

SEMICONDUCTOR DEVICE AND METHOD FOR MANUFACTURING THE SAME

CROSS-REFERENCE TO RELATED APPLICATION(S)

This application is a continuation of U.S. patent application Ser. No. 16/803,228, filed on Feb. 27, 2020, which is based upon and claims the benefit of priority from Japanese Patent Application No. 2019-169763, filed Sep. 18, 2019, the entire contents of which are incorporated herein by reference.

FIELD

Embodiments described herein relate generally to a semiconductor device and a method for manufacturing the same.

BACKGROUND

When a memory cell array is located at a high position above a substrate, it may be difficult to interconnect an element mounted on the substrate and an electrode layer in the memory cell array.

An example of related art includes JP-A-2010-129686.

DETAILED DESCRIPTION

Figure 1:
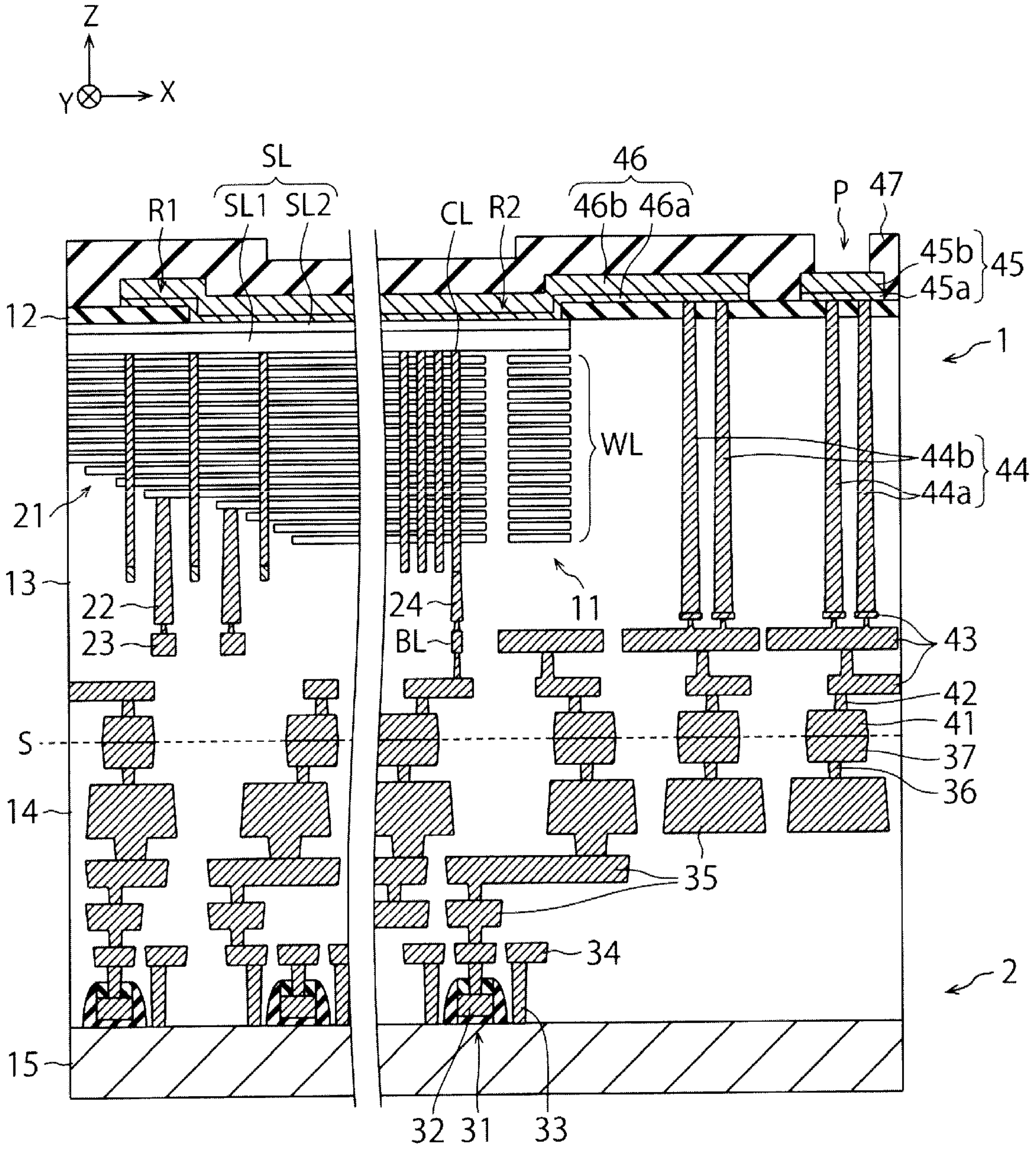
FIG. 1 is a sectional view illustrating a structure of a semiconductor device in a first embodiment.

Embodiments provide a semiconductor device configured to enable readily interconnecting an element mounted on the substrate and an electrode layer in a memory cell array and a method for manufacturing the semiconductor device.

In general, according to one embodiment, a semiconductor device includes a substrate, a logic circuit provided on the substrate, and a memory cell array provided over the logic circuit that includes a plurality of electrode layers stacked on top of one another and a semiconductor layer provided over the plurality of electrode layers. The semiconductor device further includes a first plug and a second plug provided above the logic circuit and electrically connected to the logic circuit, a bonding pad provided on the first plug, and a metallic wiring layer provided on the memory cell array, electrically connected to the semiconductor layer, and electrically connected to the second plug.

Hereinafter, embodiments according to the present disclosure will be described with reference to the drawings. In FIG. 1 to FIG. 14, the same elements are assigned the respective same reference characters, and any duplicated description thereof is omitted.

First Embodiment

FIG. 1 is a sectional view illustrating a structure of a semiconductor device in a first embodiment. The semiconductor device illustrated in FIG. 1 is a three-dimensional memory including an array chip 1 and a circuit chip 2 bonded to each other.

The array chip 1 includes a memory cell array 11, which includes a plurality of memory cells, an insulating film 12 provided on the memory cell array 11, and an interlayer insulating film 13 provided under the memory cell array 11. The insulating film 12 is an example of a first insulating film. The insulating film 12 is, for example, a silicon oxide film or a silicon nitride film. The interlayer insulating film 13 is, for example, a silicon oxide film or a stacked film including a silicon oxide film and another type of insulating film.

The circuit chip 2 is provided under the array chip 1. Reference character S denotes a bonding surface between the array chip 1 and the circuit chip 2. The circuit chip 2 includes an interlayer insulating film 14 and a substrate 15 provided under the interlayer insulating film 14. The substrate 15 is an example of a first substrate. The interlayer insulating film 14 is, for example, a silicon oxide film or a stacked film including a silicon oxide film and another type of insulating film. The substrate 15 is, for example, a semiconductor substrate such as a silicon substrate.

FIG. 1 indicates an X-direction and a Y-direction which are parallel to the surface of the substrate 15 and are perpendicular to each other and a Z-direction which is perpendicular to the surface of the substrate 15. In the present specification, a plus Z-direction is treated as an upward direction, and a minus Z-direction is treated as a downward direction. The minus Z-direction may coincide with the direction of gravitational force or may not coincide with the direction of gravitational force.

The array chip 1 includes, as a plurality of electrode layers in the memory cell array 11, a plurality of word lines WL and a source line SL. FIG. 1 illustrates a staircase structure portion 21 of the memory cell array 11. Each word line WL is electrically connected to a word wiring layer 23 via a contact plug 22. Each columnar portion CL, which penetrates through a plurality of word lines WL, is electrically connected to a bit line BL via a via-plug 24, and is also electrically connected to the source lune SL. The source line SL is provided on such word lines WL and is electrically connected to a source wiring layer 46 described below. The source line SL includes a first layer SL1, which is a semiconductor layer, and a second layer SL2, which is a metallic layer. The second layer SL2 is provided on the first layer SL1, and functions as a barrier metal layer. The first layer SL1 is, for example, an n+ type polysilicon layer. The second layer SL2 is, for example, a titanium (Ti) layer or a stacked film including a titanium layer and a titanium nitride film.

The circuit chip 2 includes a plurality of transistors 31. Each transistor 31 includes a gate electrode 32, which is provided on the substrate 15 via a gate insulating film, and a source diffusion layer and a drain diffusion layer (not illustrated), which are provided inside the substrate 15. Moreover, the circuit chip 2 further includes a plurality of contact plugs 33, which is provided on the source diffusion layer or the drain diffusion layer of the transistor 31, a wiring layer 34, which is provided on the contact plugs 33 and includes a plurality of wirings, and a plurality of wiring layers 35, which is provided on the wiring layer 34 and each of which includes a plurality of wirings.

The circuit chip 2 further includes a plurality of via-plugs 36 provided on the wiring layer 35 and a plurality of metal pads 37 provided on the via-plugs 36. The metal pad 37 is, for example, a copper (Cu) layer or an aluminum (Al) layer. The metal pad 37 is an example of a first pad. The circuit chip 2 in the present embodiment functions as a control circuit (i.e., a logic circuit) which controls an operation of the array chip 1. The control circuit is configured with, for example, transistors 31, and is electrically connected to the metal pads 37. The control circuit includes, for example, a peripheral circuit for the memory cell array 11.

The array chip 1 includes, a plurality of metal pads 41 provided on the metal pads 37, a plurality of via-plugs 42 provided on the metal pads 41, a plurality of wiring layers 43 provided on the via-plugs 42 and each including a plurality of wirings. The metal pad 41 is, for example, a copper layer or an aluminum layer. The metal pad 41 is an example of a second pad. Moreover, the array chip 1 further includes a plurality of via-plugs 44 provided on the wiring layer 43, and the via-plugs 44 include a plurality of via-plugs **44*a* and a plurality of via-plugs 44*b*. The via-plug 44*a* is an example of a first plug, and the via-plug 44*b* is an example of a second plug. The via-plugs 44 are provided lateral to the memory cell array 11 outside the memory cell array 11**.

The array chip 1 further includes a metal pad 45, a source wiring layer 46, and a passivation film 47.

The metal pad 45 is provided on the via-plugs **44*a* and the insulating film 12, and is in contact with the via-plugs 44*a* to be electrically connected to the via-plugs 44*a*. The metal pad 45** in the present embodiment functions as an external connection pad (in other words, a bonding pad) of the semiconductor device.

The source wiring layer 46 is provided on the via-plugs **44*b*, the memory cell array 11, and the insulating film 12, and is in contact with the via-plugs 44*b* to be electrically connected to the via-plugs 44*b*. The source wiring layer 46 is an example of a metallic wiring layer. The source wiring layer 46 includes a first portion R1 provided on the memory cell array 11 via the insulating film 12 and a second portion R2 provided on the memory cell array 11 in the insulating film 12. As a result, the source wiring layer 46** is provided on the source line SL in such a way as to be in contact with the source line SL and is electrically connected to the source line SL.

The metal pad 45 and the source wiring layer 46 in the present embodiment are provided in one and the same wiring layer, and include barrier metal layers **45*a* and 46*a* and wiring material layers 45*b* and 46*b* provided on the barrier metal layers 45*a* and 46*a*, respectively. Each of the barrier metal layers 45*a* and 46*a* is, for example, a metallic layer such as a titanium nitride film. Each of the wiring material layers 45*b* and 46*b* is, for example, a metallic layer such as an aluminum layer. The metal pad 45 and the source wiring layer 46 in the present embodiment are formed by forming one wiring layer on the memory cell array 11 and the insulating film 12 and processing the formed wiring layer, as described below, so that the metal pad 45 and the source wiring layer 46** are formed in the wiring layer.

The metal pad 45 and the source wiring layer 46 in the present embodiment are respectively provided on the via-plugs **44*a* and 44*b*, which are provided in such a way as to penetrate through the insulating film 12. Therefore, each of the upper end of the via-plug 44*a* and the upper end of the via-plug 44*b* is provided at a position higher than the upper surface of the source line SL. Similarly, each of the lower surface of the metal pad 45 and the lower surface of the first portion R1 of the source wiring layer 46 is provided at a position higher than the upper surface of the source line SL. On the other hand, the lower surface of the second portion R2 of the source wiring layer 46 is in contact with the upper surface of the source line SL. Specifically, the barrier metal layer 46*a* of the source wiring layer 46 is in contact with the second layer SL2** of the source line SL.

The passivation film 47 is provided on the metal pad 45, the source wiring layer 46, and the insulating film 12. The passivation film 47 is, for example, an insulating film such as a silicon oxide film, and has an opening P via which the upper surface of the metal pad 45 is exposed. The metal pad 45 is able to be connected to a mounting substrate or another device by, for example, a bonding wire, a solder ball, or a metal bump via the opening P.

As illustrated in FIG. 1, the memory cell array 11 is electrically connected to the circuit chip 2 via, for example, the metal pads 41 and 37 provided below the memory cell array 11, and is electrically connected to, for example, the transistors 31, which configure a logic circuit. This also applies to the metal pad 45 and the source wiring layer 46. The metal pad 45 is electrically connected to the circuit chip 2 via, for example, the via-plugs **44*a* and the metal pads 41 and 37 provided below the via-plugs 44*a*, and the source wiring layer 46 is electrically connected to the circuit chip 2 via, for example, the via-plugs 44*b* and the metal pads 41 and 37 provided below the via-plugs 44*b*. In the present embodiment, in a cross-section illustrated in FIG. 1, the memory cell array 11 is electrically connected to the transistors 31, and, in a cross-section different from that illustrated in FIG. 1, the metal pad 45 and the source wiring layer 46 are electrically connected to the transistors 31**.

Figure 2:
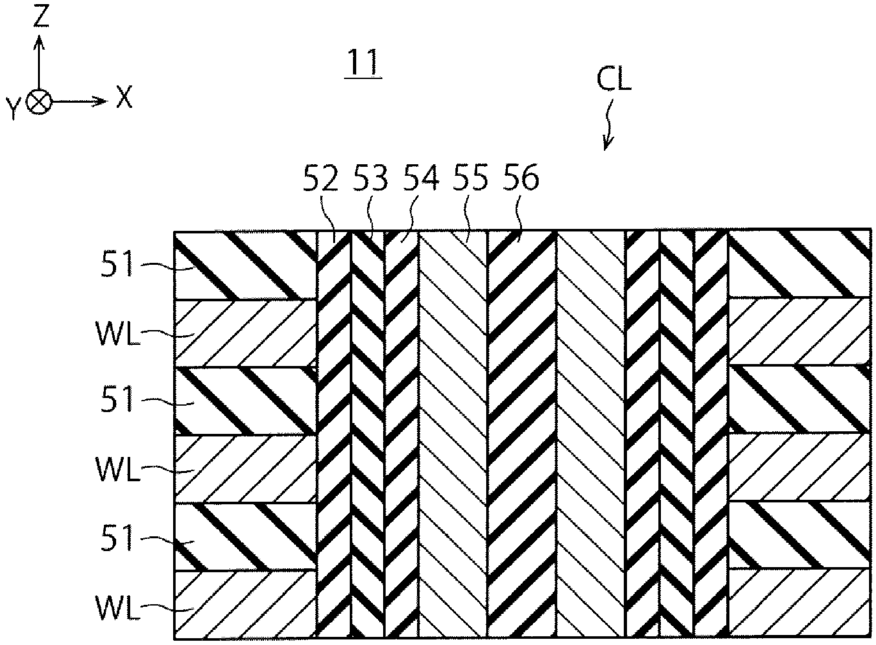
FIG. 2 is a sectional view illustrating a structure of a columnar portion in the first embodiment.

FIG. 2 is a sectional view illustrating a configuration of the columnar portion CL in the first embodiment.

As illustrated in FIG. 2, the memory cell array 11 includes a plurality of word lines WL and a plurality of insulating layers 51 stacked in layers alternately one by one on the interlayer insulating film 13 (see FIG. 1). The word line WL is, for example, a tungsten (W) layer. The insulating layer 51 is, for example, a silicon oxide film.

The columnar portion CL includes, in order, a block insulating film 52, a charge storage layer 53, a tunnel insulating film 54, a channel semiconductor layer 55, and a core insulating film 56. The charge storage layer 53 is, for example, a silicon oxide film, and is formed on the side surfaces of the word lines WL and the insulating layers 51 via the block insulating film 52. The charge storage layer 53 may be a semiconductor layer such as a polysilicon layer. The channel semiconductor layer 55 is, for example, a polysilicon layer, and is formed on the side surface of the charge storage layer 53 via the tunnel insulating film 54. Each of the block insulating film 52, the tunnel insulating film 54, and the core insulating film 56 is, for example, a silicon oxide film or a metallic insulating film.

FIG. 3 to FIG. 8 are sectional views illustrating a method for manufacturing the semiconductor device in the first embodiment.

Figure 3:
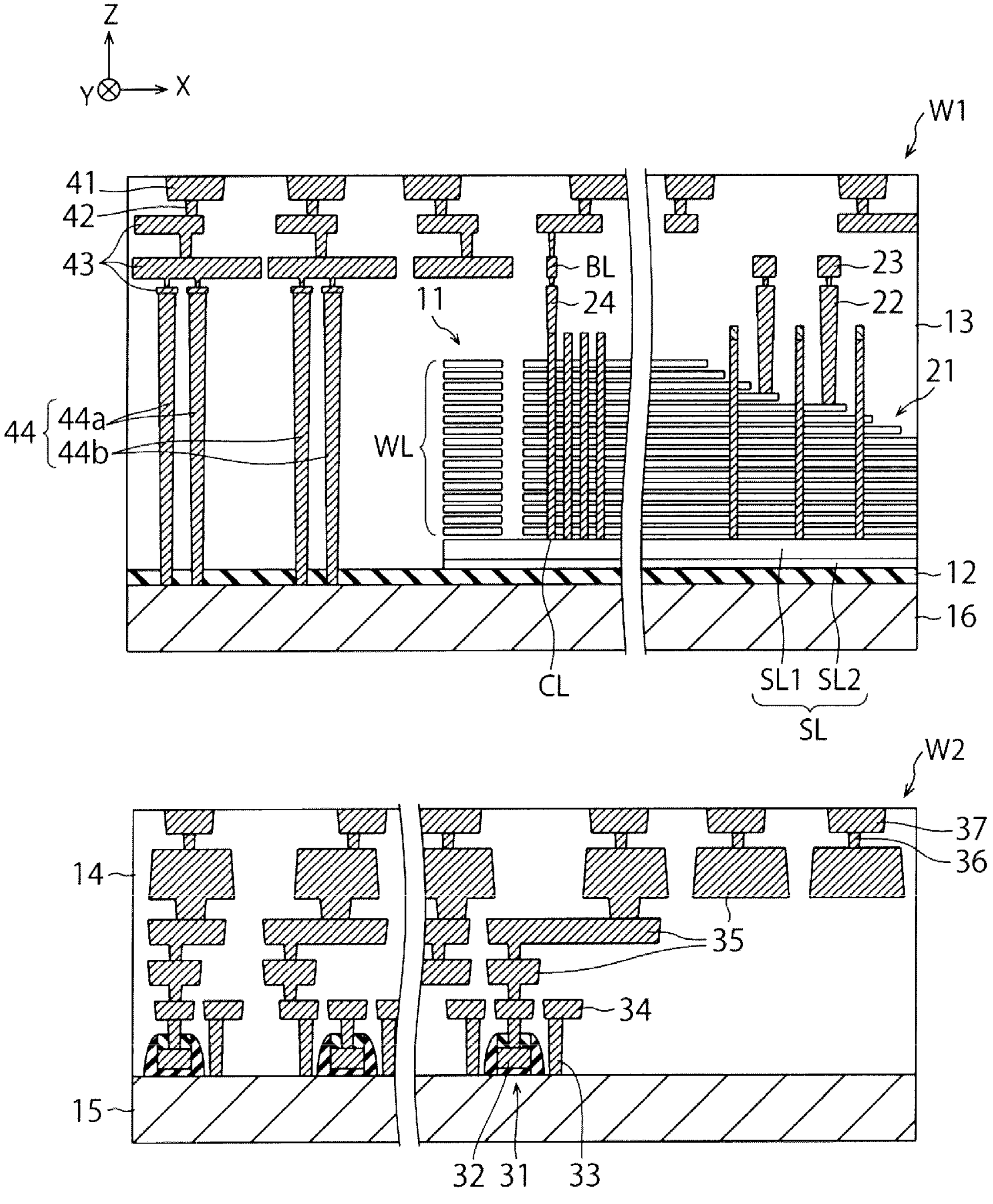
FIG. 3 is a sectional view (i.e., the first out of six sectional views) illustrating a method for manufacturing the semiconductor device in the first embodiment.

FIG. 3 illustrates an array wafer W1 including a plurality of array chips 1 and a circuit wafer W2 including a plurality of circuit chips 2. The array wafer W1 is also called a memory wafer, and the circuit wafer W2 is also called a complementary metal-oxide semiconductor (CMOS) wafer.

It should be noted that the orientation of the memory wafer W1 illustrated in FIG. 3 is opposite to the orientation of the array chip 1 illustrated in FIG. 1. In the present embodiment, a semiconductor device is manufactured by bonding the array wafer W1 and the circuit wafer W2 to each other. FIG. 3 illustrates a memory wafer W1 obtained before the orientation thereof is reversed for the purpose of bonding, and FIG. 1 illustrates an array chip 1 obtained after the orientation thereof is reversed for the purpose of bonding and bonding and dicing thereof are completed. It should be noted that the memory wafer W1 includes a substrate 16 provided under the insulating film 12. The substrate 16 is, for example, a semiconductor substrate such as a silicon substrate. The substrate 16 is an example of a second substrate.

In the present embodiment, first, as illustrated in FIG. 3, the method forms, for example, the memory cell array 11, the insulating film 12, the interlayer insulating film 13, the staircase structure portion 21, and the metal pads 41 on the substrate 16 of the memory wafer W1, and forms, for example, the interlayer insulating film 14, the transistors 31, and the metal pads 37 on the substrate 15 of the circuit wafer W2.

For example, when forming, for example, the memory cell array 11 on the substrate 16, the method forms, in turn, the insulating film 12, the second layer SL2 of the source line SL, and the first layer SL1 of the source line SL on the substrate 16, and then forms a plurality of insulating layers 51 and a plurality of sacrifice layers alternately one by one on the source line SL. Next, the method forms a plurality of columnar portions CL in the insulating layers 51 and the sacrifice layers, and, after that, replaces the sacrifice layers by a plurality of word lines WL. In this way, the memory cell array 11 is formed on the substrate 16 via the insulating film 12. Moreover, when forming, for example, the metal pads 41 on the substrate 16, the method forms, in turn, the via-plugs 44, the wiring layers 43, the via-plugs 42, and the metal pads 41 on the substrate 16. At that time, the via-plugs 44 are formed in such a way as to penetrate through the insulating film 12 and reach the substrate 16.

On the other hand, when forming the transistors 31 and the metal pads 37 on the substrate 15, the method forms, in turn, the gate electrode 32, the contact plugs 33, the wiring layer 34, the wiring layers 35, the via-plugs 36, and the metal pads 37 on the substrate 15.

Figure 4:
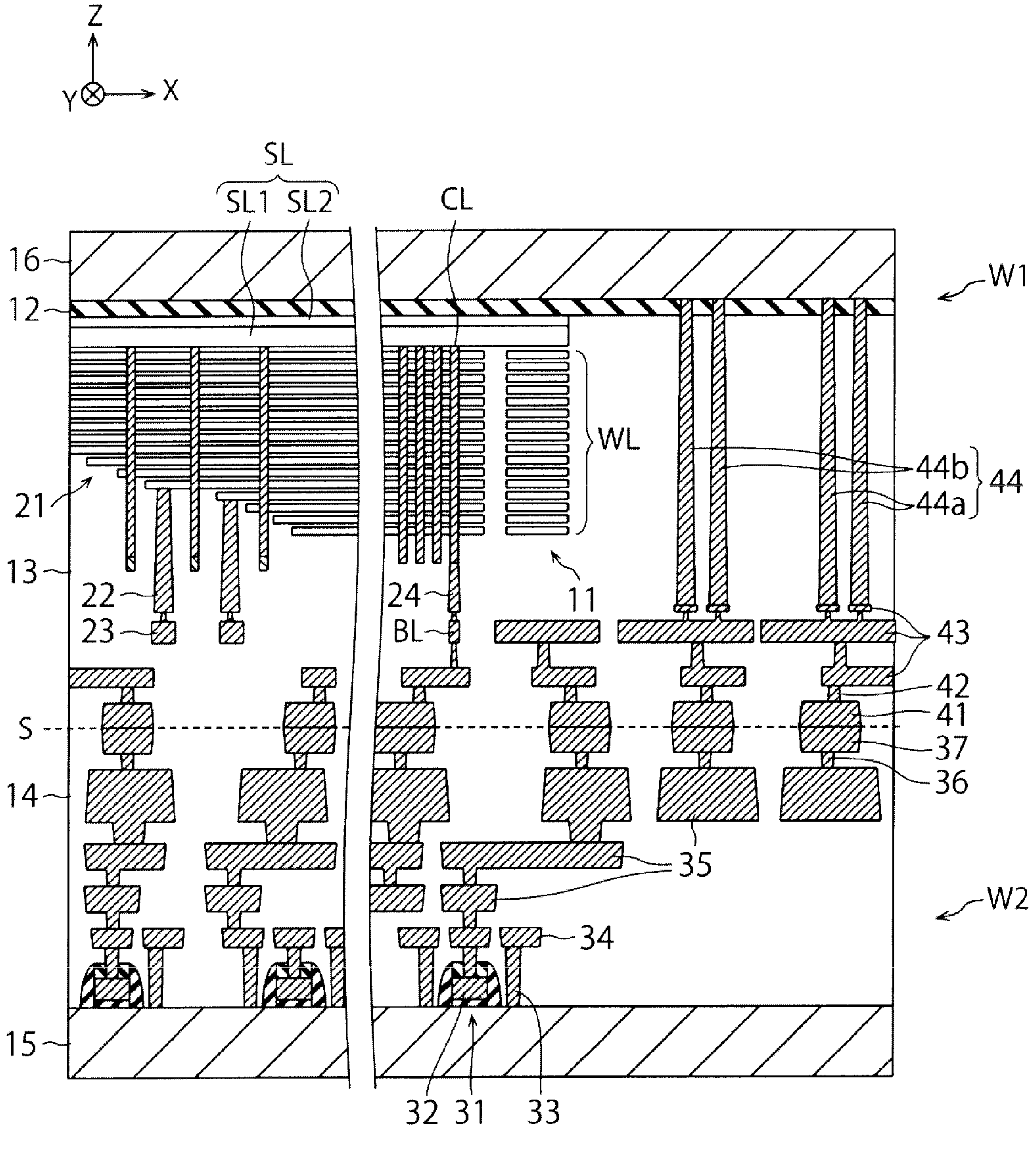
FIG. 4 is a sectional view (i.e., the second out of six sectional views) illustrating the method for manufacturing the semiconductor device in the first embodiment.

Next, as illustrated in FIG. 4, the method bonds the array wafer W1 and the circuit wafer W2 to each other by mechanical pressure. With this, the interlayer insulating film 13 and the interlayer insulating film 14 are stuck to each other. Next, the method anneals the array wafer W1 and the circuit wafer W2 at 400° C. With this, the metal pads 41 and the metal pads 37 are joined to each other. As a result, the substrate 15 and the substrate 16 are bonded to each other via the interlayer insulating film 13 and the interlayer insulating film 14. FIG. 4 illustrates, for example, the memory cell array 11, the via-plugs 44, and the substrate 16 located above the substrate 15 as a result of such bonding.

Figure 5:
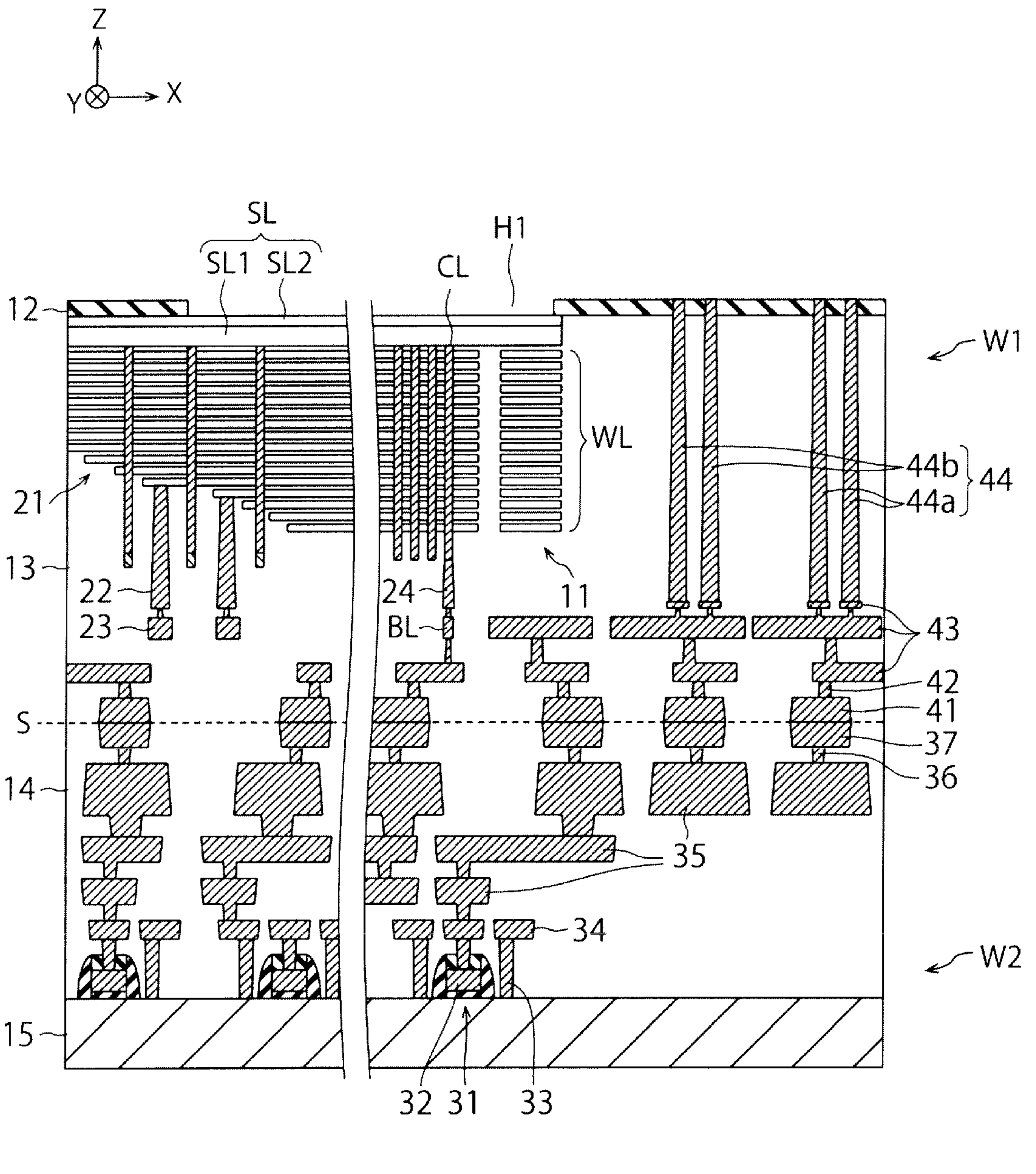
FIG. 5 is a sectional view (i.e., the third out of six sectional views) illustrating the method for manufacturing the semiconductor device in the first embodiment.

Next, the method makes the substrate 15 into a thin film shape by chemical mechanical polishing (CMP) and then removes the substrate 16 by CMP to cause the insulating film 12 to become exposed, as illustrated in FIG. 5. Next, the method forms an opening H1 in the insulating film 12 by lithography and etching to cause the source line SL of the memory cell array 11 to become exposed in the opening H1, as illustrated in FIG. 5.

Figure 6:
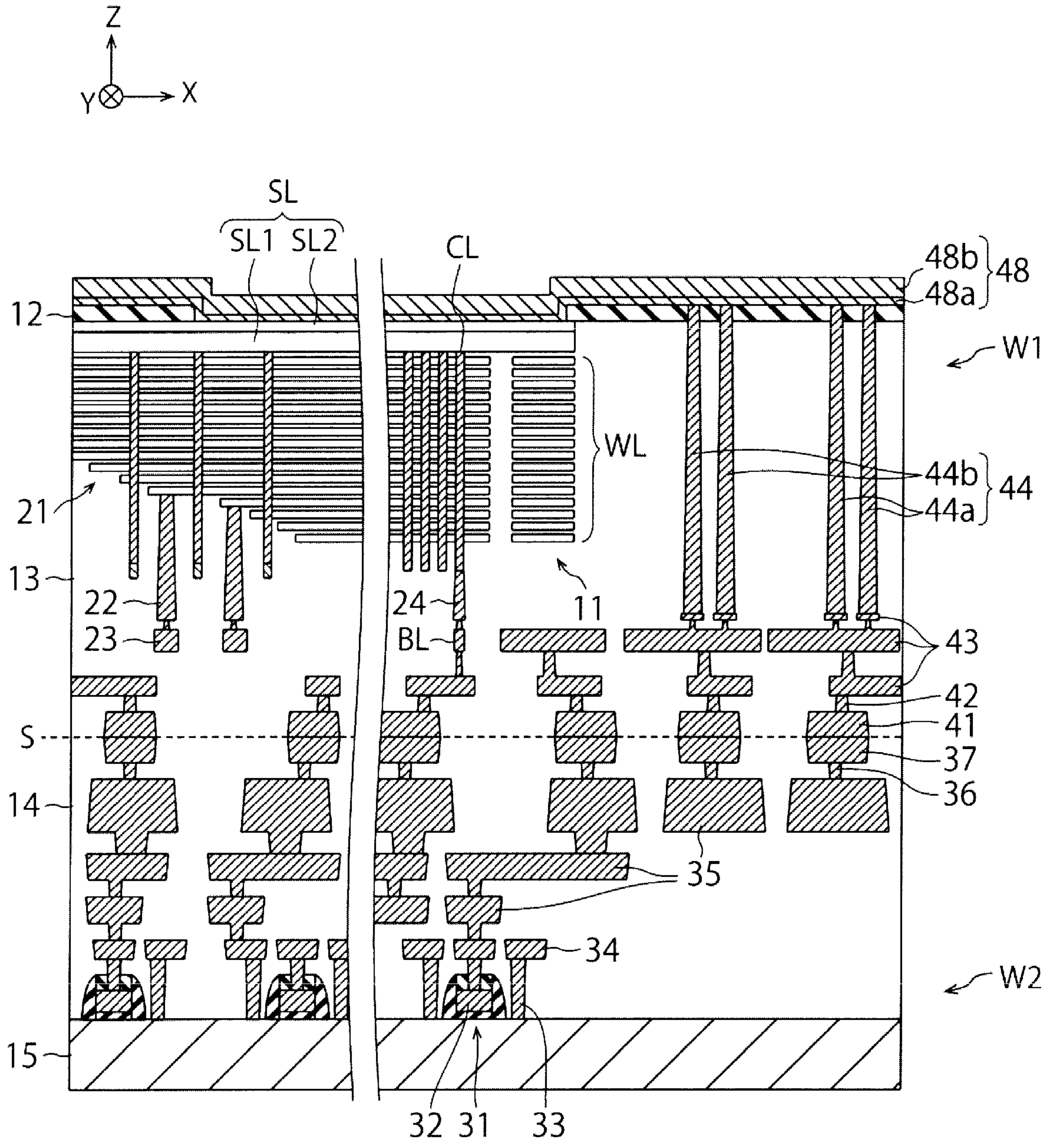
FIG. 6 is a sectional view (i.e., the fourth out of six sectional views) illustrating the method for manufacturing the semiconductor device in the first embodiment.

Next, the method forms a wiring layer 48 on the source line SL and the insulating film 12 by sputtering, as illustrated in FIG. 6. The wiring layer 48 includes a barrier metal layer **48*a* provided on the source line SL and the insulating film 12 and a wiring material layer 48*b* formed on the barrier metal layer 48*a*. The barrier metal layer 48*a* is, for example, a titanium nitride film. The wiring material layer 48*b*** is, for example, an aluminum layer.

Figure 7:
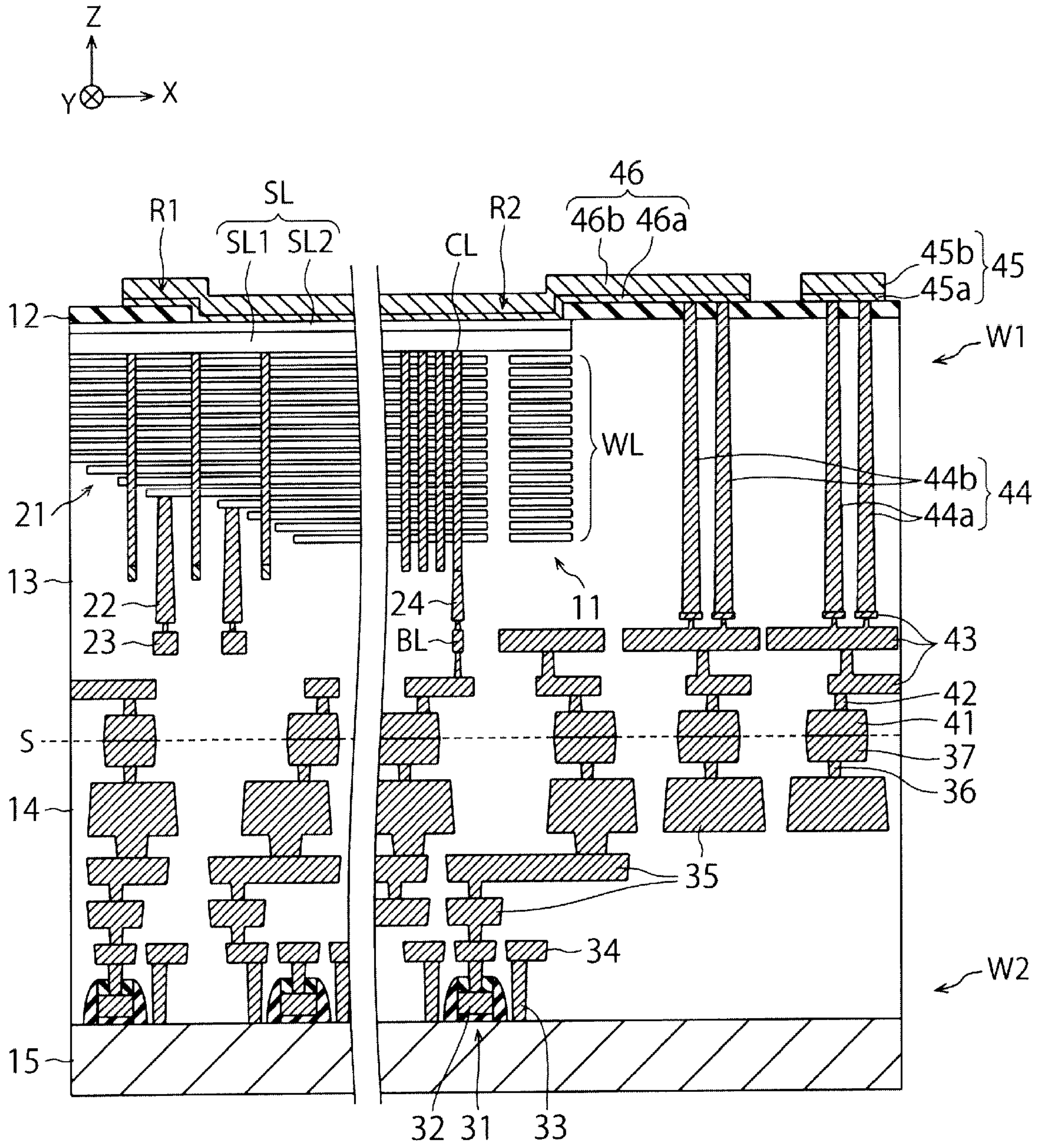
FIG. 7 is a sectional view (i.e., the fifth out of six sectional views) illustrating the method for manufacturing the semiconductor device in the first embodiment.

Next, the method processes the wiring layer 48 by reactive ion etching (RIE), as illustrated in FIG. 7. As a result, the metal pad 45 and the source wiring layer 46 are formed in the wiring layer 48. The metal pad 45 is formed on the via-plugs **44*a*, and the source wiring layer 46 is formed on the via-plugs 44*b* and the source line SL. The source wiring layer 46 illustrated in FIG. 7 includes the first portion R1 provided on the memory cell array 11 via the insulating film 12 and the second portion R2 provided on the memory cell array 11 in the insulating film 12**.

In this way, the metal pad 45 and the source wiring layer 46 in the present embodiment are formed by processing the same wiring layer 48. The barrier metal layer **45*a* of the metal pad 45 and the barrier metal layer 46*a* of the source wiring layer 46 derive from the barrier metal layer 48*a* of the wiring layer 48, and the wiring material layer 45*b* of the metal pad 45 and the wiring material layer 46*b* of the source wiring layer 46 derive from the wiring material layer 48*b* of the wiring layer 48**.

Figure 8:
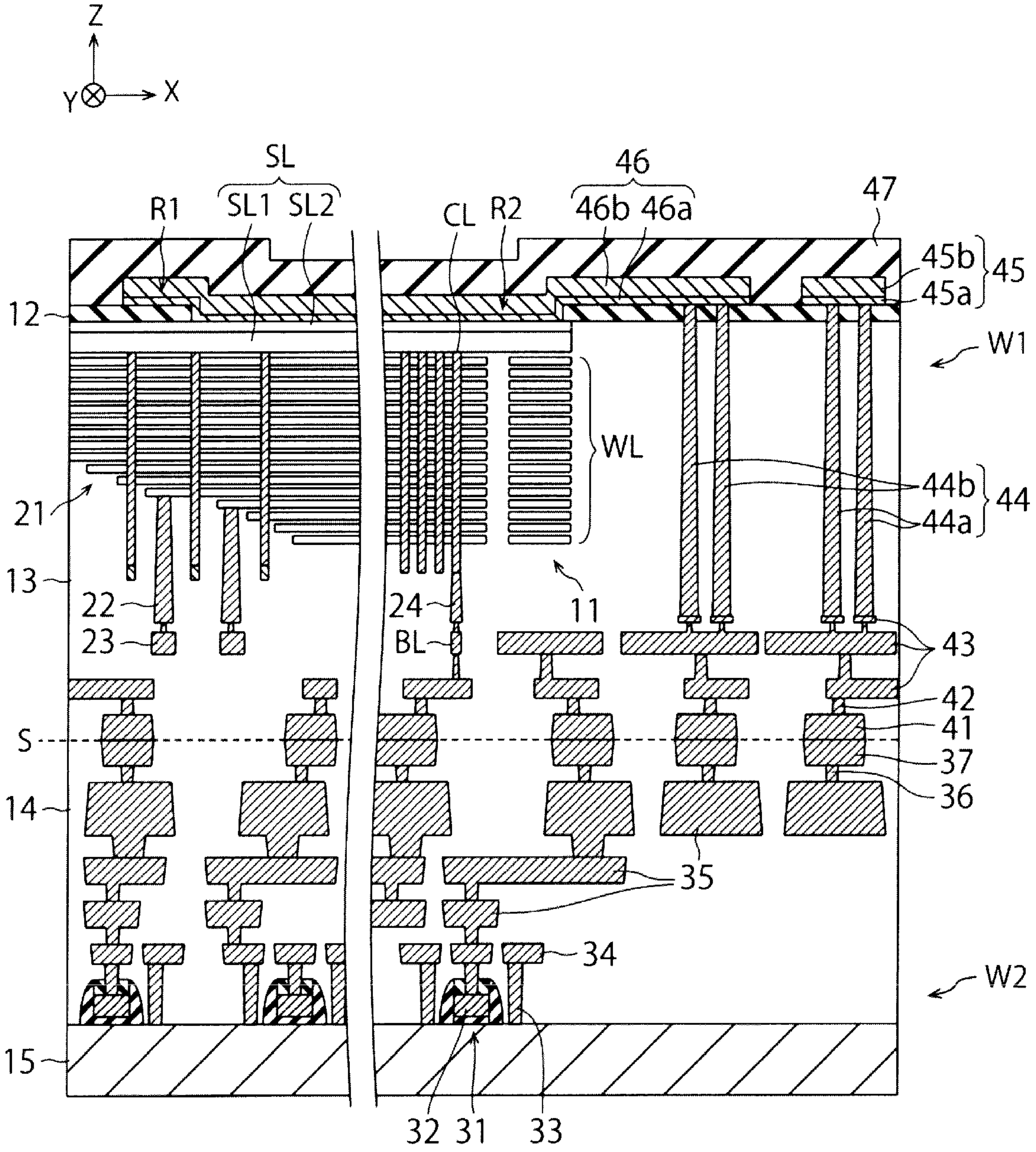
FIG. 8 is a sectional view (i.e., the sixth out of six sectional views) illustrating the method for manufacturing the semiconductor device in the first embodiment.

Next, the method forms the passivation film 47 on the metal pad 45, the source wiring layer 46, and the insulating film 12, as illustrated in FIG. 8. After that, the method forms the opening P in the passivation film 47 to cause the metal pad 45 to become exposed in the opening P (see FIG. 1). Additionally, the method cuts the array wafer W1 and the circuit wafer W2 into a plurality of chips. In this way, the semiconductor device in the present embodiment is manufactured.

In the following description, referring back to FIG. 1, the source line SL and the source wiring layer 46 in the present embodiment are described.

In considering the location of the source wiring layer 46, locating the source wiring layer 46 below the memory cell array 11 as with the word wiring layer 23 may be conceived. In this case, to electrically interconnect the source line SL and the source wiring layer 46, a plurality of contact plugs penetrating through a plurality of word lines WL is required to be provided between the source line SL and the source wiring layer 46. Such a presence of the contact plugs becomes an obstacle to increasing the degree of integration of a semiconductor device.

Moreover, since the source line SL is formed before the array wafer W1 and the circuit wafer W2 are bonded to each other, it is difficult to form the source line SL with use of a thick metallic layer. The reason is that the metallic layer may be affected by the effect of annealing performed for bonding. Therefore, it is conceivable that the source line SL is formed from only a semiconductor layer or is formed from a semiconductor layer and a thin metallic layer. However, in these cases, since the resistance of the source line SL becomes high, it is required that a large number of contact plugs are located between the source line SL and the source wiring layer 46 to prevent or reduce any voltage drop in the source line SL. However, such a presence of a large number of contact plugs becomes a major obstacle to increasing the degree of integration of a semiconductor device.

Therefore, the method in the present embodiment locates the source wiring layer 46 on the memory cell array 11, specifically, locates the source wiring layer 46 on the source line SL, thus electrically connecting the source wiring layer 46 to the source line SL. This eliminates the necessity of providing a plurality of contact plugs penetrating through a plurality of word lines WL between the source line SL and the source wiring layer 46, thus enabling increasing the degree of integration of a semiconductor device.

In this case, since the source wiring layer 46 is located at a high position above the substrate 15, it can also be considered that it becomes difficult to electrically connect the source wiring layer 46 to, for example, the transistors 31. The reason is that, since the semiconductor device in the present embodiment is formed by bonding the array wafer W1 and the circuit wafer W2 to each other, the memory cell array 11 is located at a high position above the substrate 15, so that the source wiring layer 46 on the memory cell array 11 is located at a higher position above the substrate 15. If the source wiring layer 46 is located on the memory cell array 11, the distance between the source wiring layer 46 and the transistors 31 becomes larger as compared with the case where the source wiring layer 46 is located under the memory cell array 11.

However, the source wiring layer 46 in the present embodiment is located at the same height as that of the metal pad (in other words, bonding pad) 45, and is, therefore, able to be connected to the transistors 31 by a method similar to that employed for the metal pad 45. More specifically, the source wiring layer 46 is able to be connected to the transistors 31 via the via-plugs 44*b* in a manner similar to the manner in which the metal pad 45 is connected to the transistors 31 via the via-plugs 44*a*. Therefore, even when the source wiring layer 46 is located at a high position above the substrate 15, the source wiring layer 46 is enabled to be readily connected to, for example, the transistors 31. Therefore, according to the present embodiment, the source line SL is enabled to be readily connected to, for example, the transistors 31 via the source wiring layer 46, which is located as described above, and the via-plugs 44*b*.

Moreover, since the source wiring layer 46 in the present embodiment is formed after the array wafer W1 and the circuit wafer W2 are bonded to each other, the source wiring layer 46 can be prevented from being affected by the effect of annealing performed for bonding. Therefore, it becomes easy to form the source wiring layer 46 with use of a thick metallic layer, so that the total resistance of the source line SL and the source wiring layer 46 can be reduced. This enables decreasing the number of via-plugs 44*b* and thus enables increasing the degree of integration of a semiconductor device.

Furthermore, while, in the present embodiment, the source wiring layer 46 configured to electrically interconnect the source line SL and the transistors 31 is described above, the present embodiment may also be applied to a wiring layer configured to electrically interconnect another electrode layer located in the memory cell array 11 and another element on the substrate 15. An example of such an electrode layer is a word line WL or a select line, and an example of such an element is a memory cell or a diode.

Moreover, the metal pad 45 and the source wiring layer 46 in the present embodiment are provided in the same wiring layer, but may be provided in respective different wiring layers. For example, a configuration in which a wiring layer is formed and a metal pad 45 is formed by processing such a wiring layer and, after that, another wiring layer is formed and a source wiring layer 46 is formed by processing such another wiring layer may be employed. However, in a case where the metal pad 45 and the source wiring layer 46 are provided in the same wiring layer, an advantage of being able to simultaneously form the metal pad 45 and the source wiring layer 46 can be obtained.

As described above, the semiconductor device in the present embodiment includes a source wiring layer 46 provided on the memory cell array 11, electrically connected to the source line SL, and electrically connected to the via-plugs 44*b*. Therefore, according to the present embodiment, an element such as the transistor 31 on the substrate 15 and an electrode layer such as the source line SL in the memory cell array 11 are enabled to be readily interconnected.

Furthermore, while, in the present embodiment, the array wafer W1 and the circuit wafer W2 are bonded to each other, instead, two array wafers W1 may be bonded to each other. Contents described above with reference to FIG. 1 to FIG. 8 and contents described below with reference to FIG. 9 to FIG. 14 may also be applied to mutual bonding of array wafers W1.

Moreover, while FIG. 1 illustrates a boundary surface between the interlayer insulating film 13 and the interlayer insulating film 14 and a boundary surface between the metal pad 41 and the metal pad 37, these boundary surfaces usually become unobservable after the above-mentioned annealing is performed. However, positions equivalent to these boundaries may be estimated by detecting the inclinations of the side surface of the metal pad 41 and the side surface of the metal pad 37 or the positional deviation between the side surface of the metal pad 41 and the side surface of the metal pad 37.

Second to Seventh Embodiments

Figure 9:
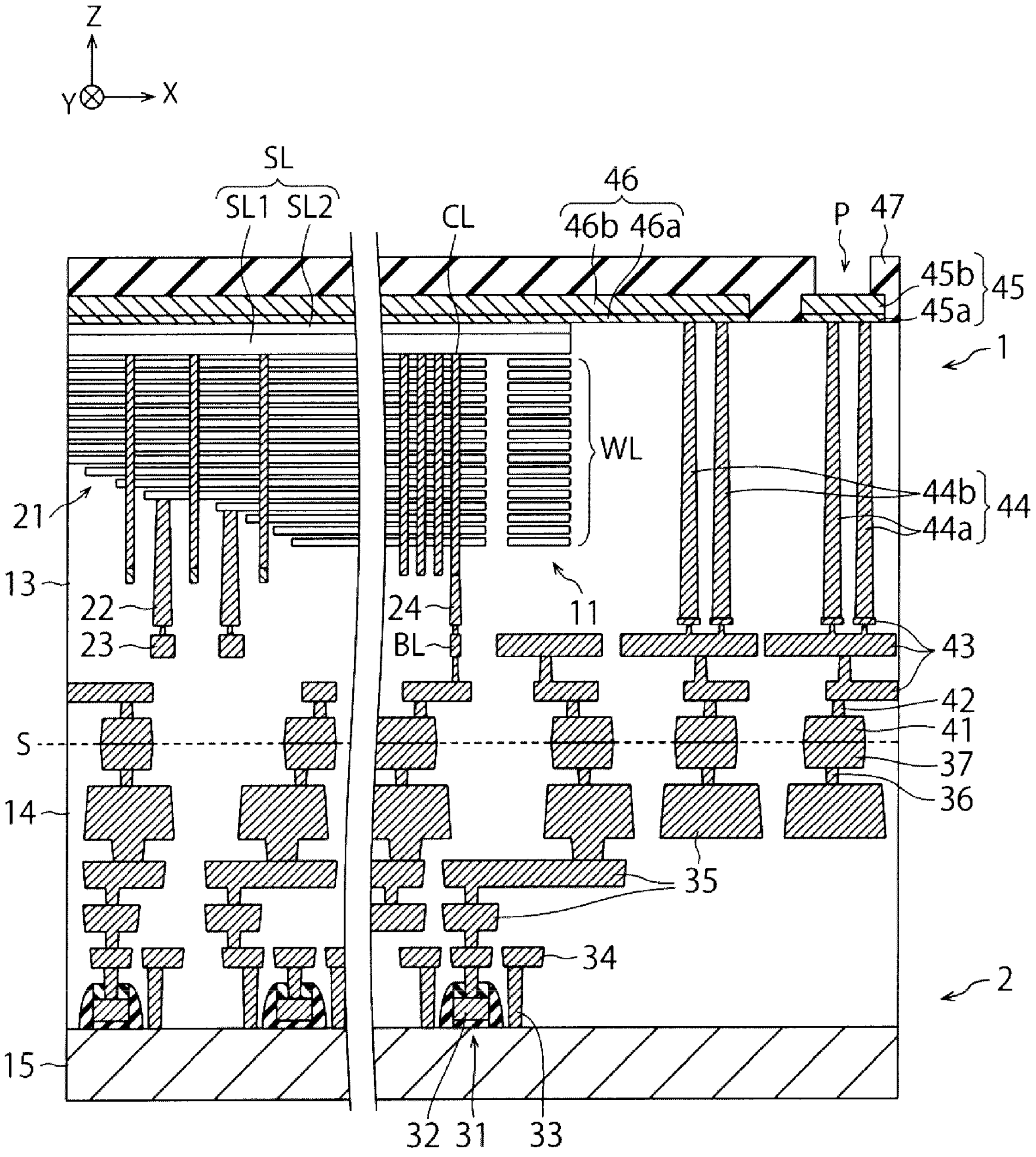
FIG. 9 is a sectional view illustrating a structure of a semiconductor device in a second embodiment.

FIG. 9 is a sectional view illustrating a structure of a semiconductor device in a second embodiment.

While the source wiring layer 46 in the first embodiment is formed on the source line SL via the insulating film 12, a source wiring layer 46 in the second embodiment is formed on the source line SL without via the insulating film 12. Such a structure may be implemented by, for example, omitting forming the insulating film 12 in the process illustrated in FIG. 3 or removing the entire insulating film 12 in the processing illustrated in FIG. 5. Such a structure has the advantage of, for example, being able to reduce the contact resistance between the source wiring layer 46 and the source line SL.

Figure 10:
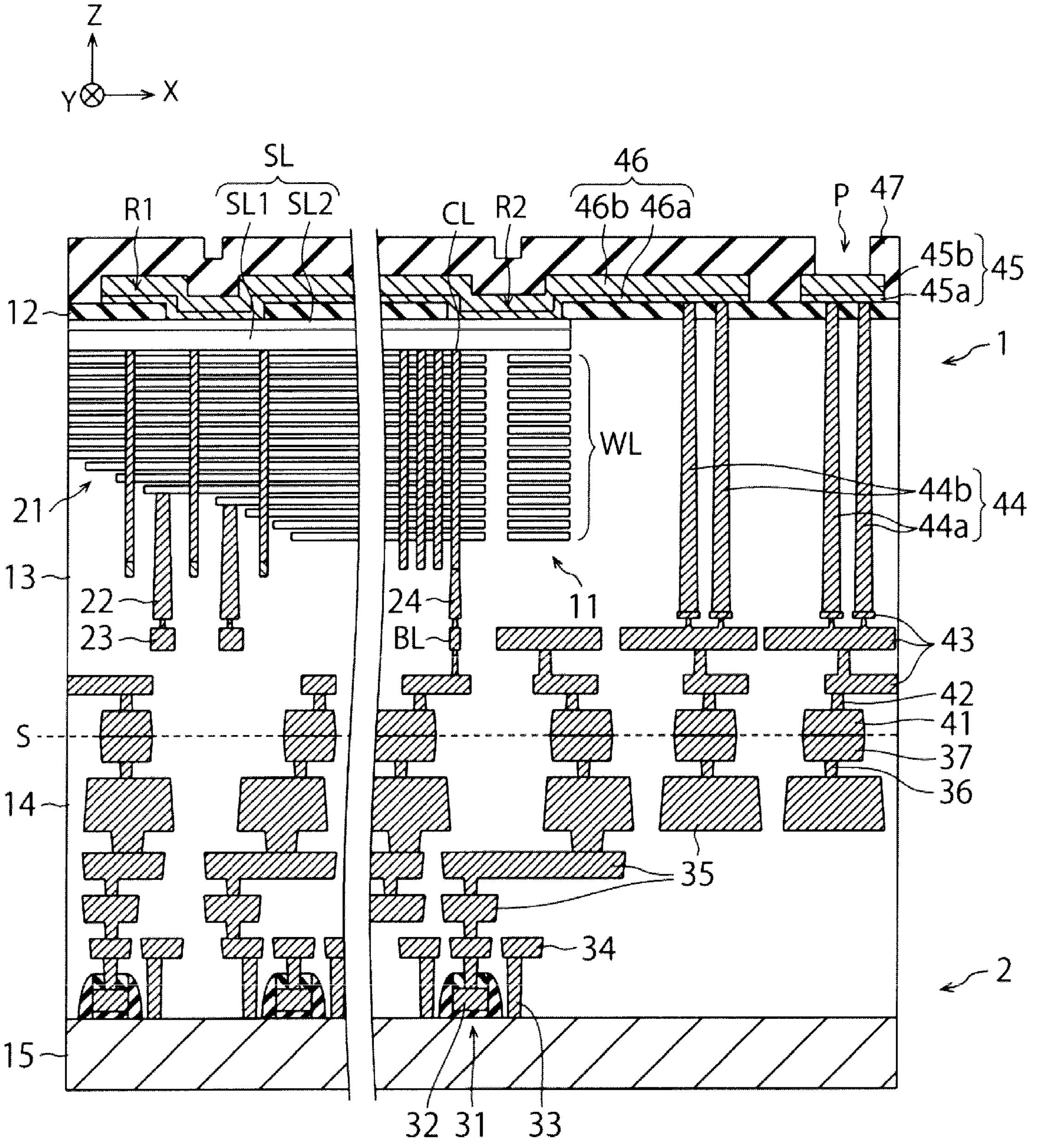
FIG. 10 is a sectional view illustrating a structure of a semiconductor device in a third embodiment.

FIG. 10 is a sectional view illustrating a structure of a semiconductor device in a third embodiment.

While the source wiring layer 46 in the first embodiment includes only one second portion R2, a source wiring layer 46 in the third embodiment includes a plurality of second portions R2. Such a structure may be implemented by, for example, forming a plurality of openings H1 in the process illustrated in FIG. 5. Such a structure has the advantage of, for example, being able to increase the degree of freedom of layout of contact portions between the source wiring layer 46 and the source line SL.

Figure 11:
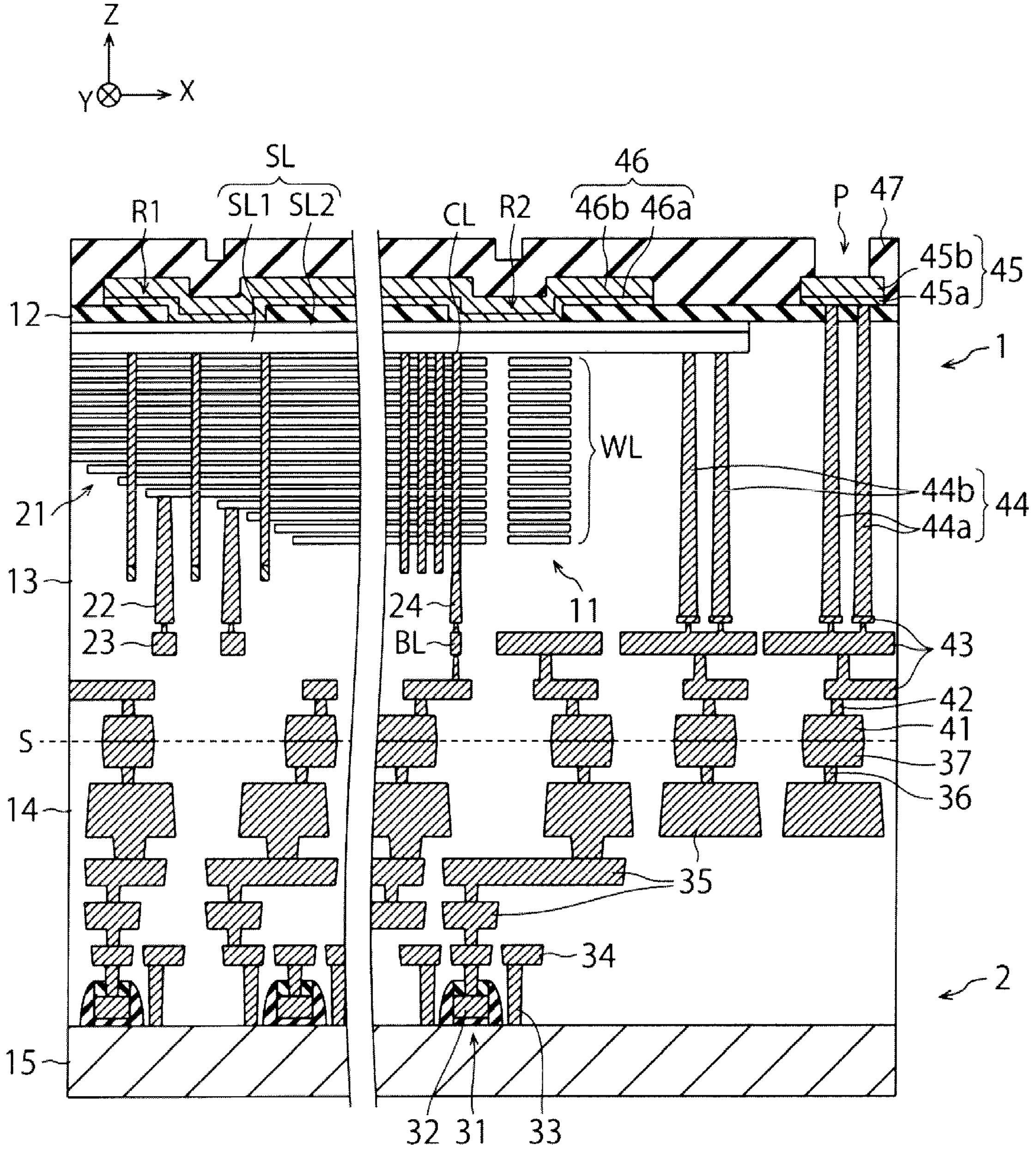
FIG. 11 is a sectional view illustrating a structure of a semiconductor device in a fourth embodiment.

FIG. 11 is a sectional view illustrating a structure of a semiconductor device in a fourth embodiment.

While the source line SL in the first embodiment is formed on the via-plugs 44*b*, a source wiring layer 46 in the fourth embodiment is formed on the source line SL and is electrically connected to the via-plugs 44*b* via the source line SL. In other words, the source wiring layer 46 in the fourth embodiment is not in contact with the via-plugs 44*b* and is indirectly connected to the via-plugs 44*b* via the source line SL. Such a structure may be implemented by, for example, forming the via-plugs 44*b* on the source line SL in the process illustrated in FIG. 3. Such a structure has the advantage of, for example, being able to increase the degree of freedom of layout of the source line SL.

Figure 12:
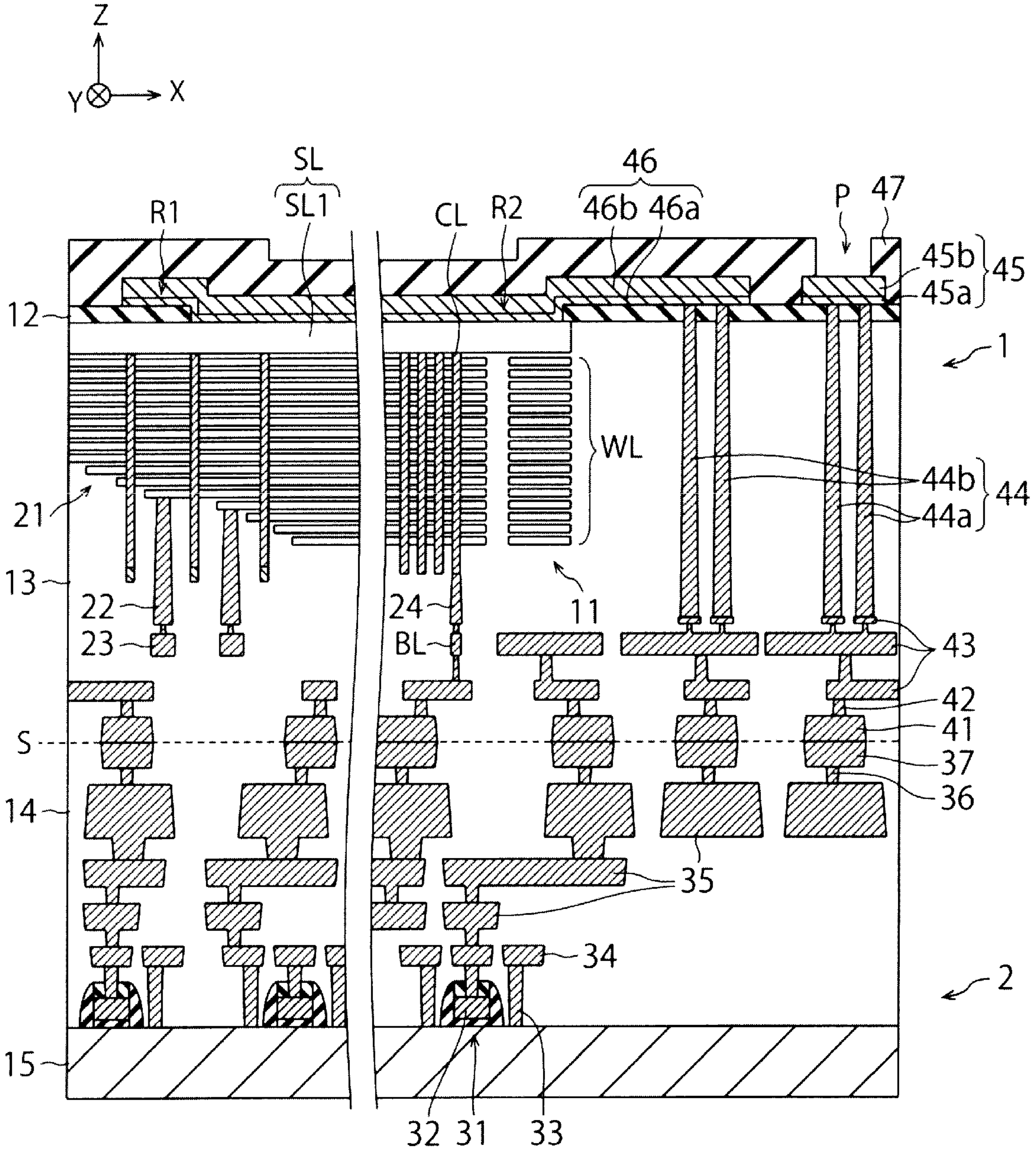
FIG. 12 is a sectional view illustrating a structure of a semiconductor device in a fifth embodiment.

FIG. 12 is a sectional view illustrating a structure of a semiconductor device in a fifth embodiment.

While the source line SL in the first embodiment includes the first layer SL1, which is a semiconductor layer, and the second layer SL2, which is a metallic layer, a source line SL in the fifth embodiment includes only a first layer SL1, which is a semiconductor layer. Such a structure may be implemented by, for example, omitting forming the second layer SL2 in the process illustrated in FIG. 3. Such a structure has the advantage of, for example, being able to easily form the source line SL. On the other hand, a structure such as described in the first embodiment has the advantage of, for example, being able to reduce the contact resistance between the source wiring layer 46 and the source line SL.

Figure 13:
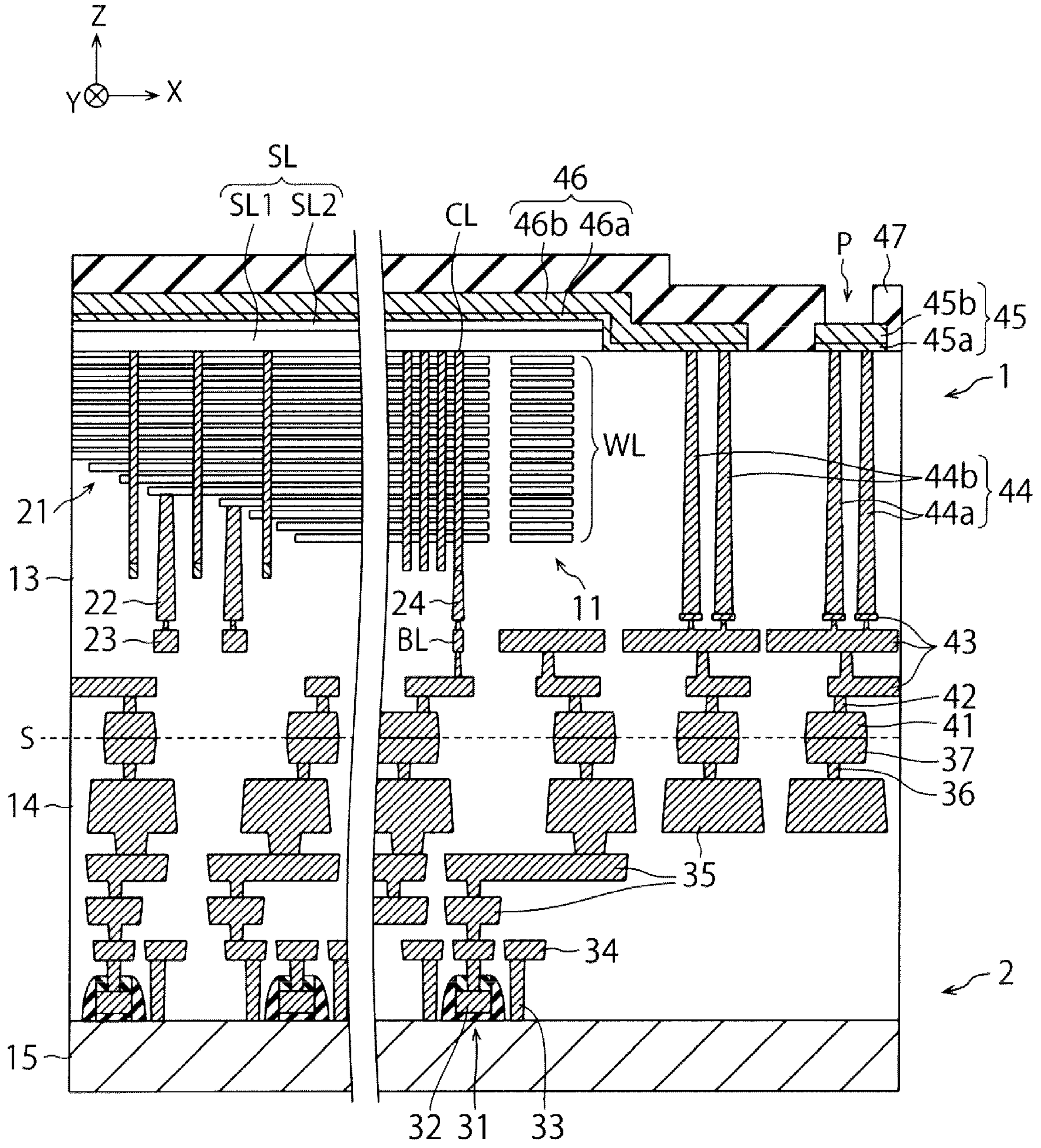
FIG. 13 is a sectional view illustrating a structure of a semiconductor device in a sixth embodiment.

FIG. 13 is a sectional view illustrating a structure of a semiconductor device in a sixth embodiment.

A source wiring layer 46 in the sixth embodiment is in contact with the upper surface and the side surface of the source line SL. Such a structure may be implemented by, for example, removing the interlayer insulating film 13 lateral to the source line SL in the process illustrated in FIG. 5. Such a structure has the advantage of, for example, being able to reduce the contact resistance between the source wiring layer 46 and the source line SL and the advantage of being able to perform elimination of gate induced drain leakage (GIDL) using the via-plugs 44*b*.

Furthermore, the first layer SL1 of the source line SL in the sixth embodiment is equivalent to, for example, a part of the substrate 16 illustrated in FIG. 4. Such a first layer SL1 is formed by omitting forming the insulating film 12, the second layer SL2, and the first layer SL1 on the substrate 16 in the process illustrated in FIG. 3 and by partially removing the substrate 16 in the process illustrated in FIG. 5. With this, the remaining portion of the substrate 16 is made into the first layer SL1. In the process illustrated in FIG. 5, then, the second layer SL2 is formed on the first layer SL1. The first layer SL1 obtained in this case is, for example, an n-type silicon layer. This also applies to a seventh embodiment described below.

Figure 14:
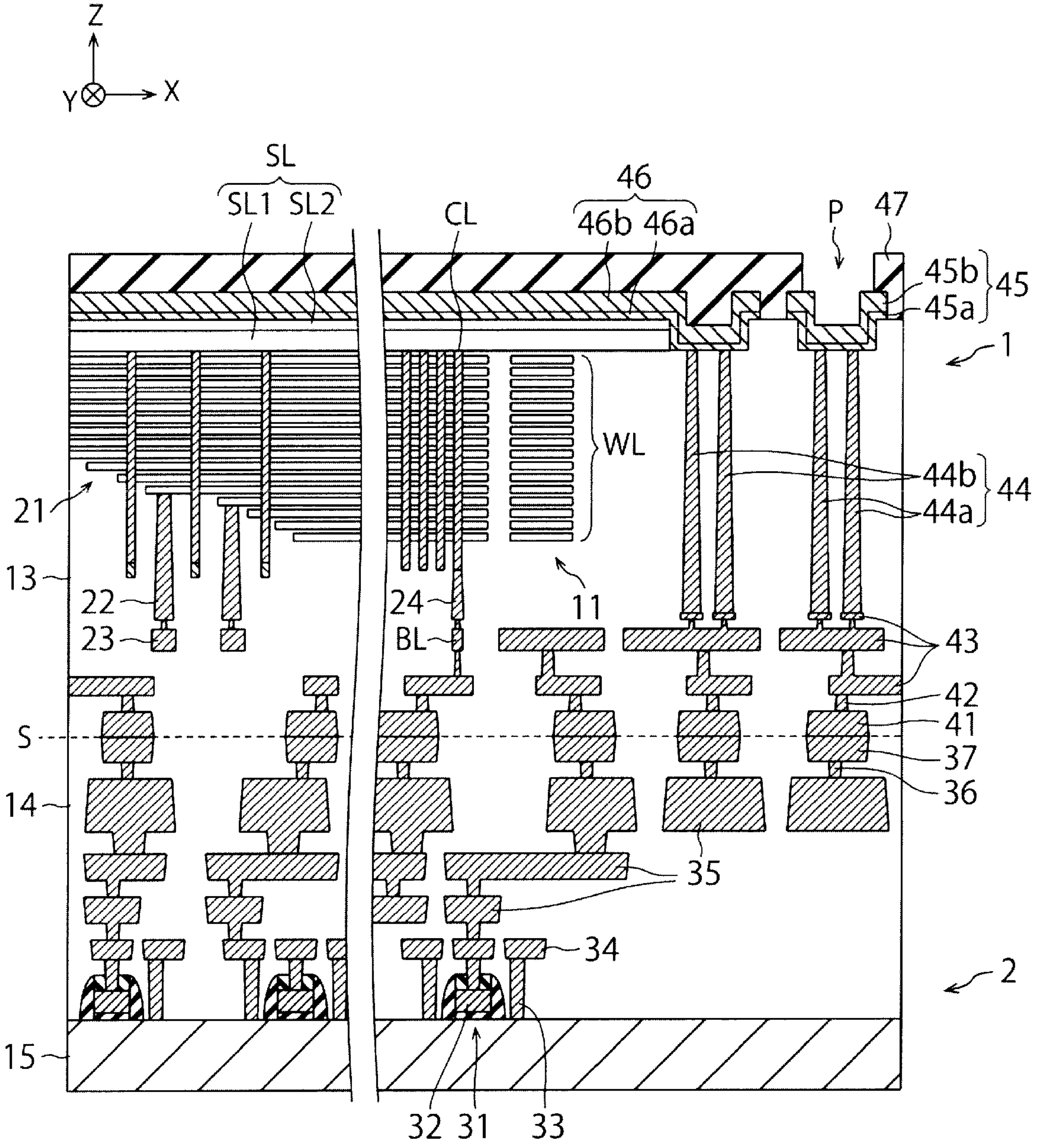
FIG. 14 is a sectional view illustrating a structure of a semiconductor device in a seventh embodiment.

FIG. 14 is a sectional view illustrating a structure of a semiconductor device in a seventh embodiment.

A source wiring layer 46 in the seventh embodiment is also in contact with the upper surface and the side surface of the source line SL, as with the source wiring layer 46 in the sixth embodiment. However, in the seventh embodiment, the height of the metal pad 45 and the height of the source wiring layer 46 are made lower only in the vicinity of the via-plugs 44. Such a structure may be implemented by, for example, removing the interlayer insulating film 13 lateral to the source line SL only in the vicinity of the via-plugs 44 in the process illustrated in FIG. 5. Such a structure has the advantage of, for example, being able to reduce the contact resistance between the source wiring layer 46 and the source line SL and the advantage of being able to perform elimination of gate induced drain leakage (GIDL) using the via-plugs 44*b*.

Furthermore, the structure illustrated in FIG. 14 has an advantage in which, for example, a region of the interlayer insulating film 13 to be removed is narrow. On the other hand, the structure illustrated in FIG. 13 has an advantage in which, for example, there is no difference in level in the metal pad 45.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
- a first substrate;
- a first transistor provided on the first substrate;
- a memory cell array, provided above the first transistor, that includes a plurality of electrode layers stacked in a first direction, a semiconductor layer provided above the plurality of electrode layers, and a metallic layer provided in contact with the semiconductor layer above the semiconductor layer;
- a first plug provided above the first transistor and electrically connected to the first transistor; and
- a metallic wiring layer provided in contact with the metallic layer and electrically connected to the first plug,
- wherein the metallic layer includes a first surface and a second surface that is opposite the first surface, the first surface in contact with the semiconductor layer and the second surface in contact with the metallic wiring layer,
- the metallic wiring layer includes a first portion in direct contact with the metallic layer and a second portion separated from the metallic layer with an insulating film, and the first plug extends through the insulating film to contact the metallic wiring layer, and
- the metallic wiring layer is provided over the semiconductor layer.

2. The semiconductor device according to claim 1, wherein the semiconductor layer is provided in a source line, and the metallic wiring layer is provided in a source wiring layer.

3. The semiconductor device according to claim 1, wherein the metallic wiring layer is provided on an upper surface and on a side surface of the semiconductor layer.

4. The semiconductor device according to claim 1, wherein the metallic wiring layer is provided on the semiconductor layer and on the first plug.

5. The semiconductor device according to claim 1, wherein the semiconductor layer is provided on the first plug, and
- wherein the metallic wiring layer is provided on the semiconductor layer and electrically connected to the first plug via the semiconductor layer.

6. The semiconductor device according to claim 1, wherein the second portion of the metallic wiring layer is elevated from the first portion of the metallic wiring layer with the insulating film.

7. The semiconductor device according to claim 1, further comprising:

a second plug provided above the first transistor and electrically connected to the first transistor; and a bonding pad provided on the second plug, wherein the bonding pad and the metallic wiring layer are provided in a same wiring layer.

8. The semiconductor device according to claim 7, wherein the first plug and the second plug are provided on a side surface of memory cell array outside of the memory cell array.

9. The semiconductor device according to claim 7, wherein the semiconductor layer is provided in a source line, and the metallic wiring layer is provided in a source wiring layer.

10. The semiconductor device according to claim 7, wherein the metallic wiring layer is provided over the semiconductor layer.

11. The semiconductor device according to claim 10, wherein the metallic wiring layer is provided on an upper surface and on a side surface of the semiconductor layer.

12. The semiconductor device according to claim 7, wherein the metallic wiring layer is provided on the semiconductor layer and on the first plug.

13. The semiconductor device according to claim 7, wherein the semiconductor layer is provided on the first plug, and wherein the metallic wiring layer is provided on the semiconductor layer and electrically connected to the first plug via the semiconductor layer.

14. The semiconductor device according to claim 7, wherein the second portion of the metallic wiring layer is elevated from the first portion of the metallic wiring layer with the insulating film.

15. The semiconductor device according to claim 7, further comprising:

a plurality of first pads provided on the first substrate; and a plurality of second pads respectively provided on the plurality of first pads, wherein each of the memory cell array, the first plug, and the second plug is electrically connected to the first transistor via at least one of the plurality of first pads and at least one of the plurality of second pads.

16. A semiconductor device comprising:

a first substrate;

a first transistor provided on the first substrate;

a memory cell array, provided above the first transistor, that includes a plurality of electrode layers stacked in a first direction, a semiconductor layer provided above the plurality of electrode layers, a memory pillar extending through the plurality of electrode layers in the first direction, a trench dividing the plurality of electrode layers into a plurality of parts in a second direction intersecting the first direction, and a metallic layer provided in contact with the semiconductor layer above the semiconductor layer;

a first plug provided above the first transistor and electrically connected to the first transistor; and a metallic wiring layer provided in contact with the metallic layer and electrically connected to the first plug, wherein the metallic layer includes a first surface and a second surface that is opposite the first surface, the first surface in contact with the semiconductor layer and the second surface in contact with the metallic wiring layer, the metallic layer contacts the metallic wiring layer above the memory pillar or the trench at multiple locations wherein the multiple locations are laterally aligned along the second surface of the metallic layer, and wherein the metallic wiring layer includes a first portion in direct contact with the metallic layer and a second portion separated from the metallic layer with an insulating film, and the first plug extends through the insulating film to contact the metallic wiring layer.

17. The semiconductor device according to claim 16, wherein the second portion of the metallic wiring layer is elevated from the first portion of the metallic wiring layer with the insulating film.

18. The semiconductor device according to claim 16, wherein the semiconductor layer is provided in a source line, and the metallic wiring layer is provided in a source wiring layer.

* * * * *